United States Patent [19]
Botos et al.

[11] Patent Number: 5,731,641
[45] Date of Patent: Mar. 24, 1998

[54] LINEAR MOTOR DRIVEN VERTICAL LIFT STAGE

[75] Inventors: Stephen J. Botos; Albert P. Ciez, both of Pittsburgh, Pa.

[73] Assignee: Aerotech, Inc., Pittsburgh, Pa.

[21] Appl. No.: 807,824

[22] Filed: Feb. 27, 1997

Related U.S. Application Data

[60] Provisional application No. 60/012,422, Feb. 28, 1996.

[51] Int. Cl.$^6$ .............................. H01L 21/68; G03F 9/00
[52] U.S. Cl. .............................. 310/12; 361/144; 359/393; 108/138; 33/568; 74/479.01
[58] Field of Search .............................. 378/131, 132; 310/12, 13, 14; 361/144, 146; 324/207.11, 207.12, 207.13; 108/138; 248/666; 33/568, 1 M; 74/479.01; 359/393

[56] References Cited

U.S. PATENT DOCUMENTS

| | | | |
|---|---|---|---|
| 4,540,277 | 9/1985 | Mayer et al. | 355/53 |
| 5,280,677 | 1/1994 | Kubo et al. | 33/568 |
| 5,323,712 | 6/1994 | Kikuri | 108/20 |

*Primary Examiner*—Steven L. Stephan
*Assistant Examiner*—Judson H. Jones
*Attorney, Agent, or Firm*—Webb Ziesenheim Bruening Logsdon Orkin & Hanson, P.C.

[57] ABSTRACT

A linear motor driven positioning stage comprises a wedge positioned between a carrier and a base and a linear motor positioned between the wedge and the base for moving the wedge relative to the base along a second axis whereby the carrier moves relative to the base along a first axis.

11 Claims, 2 Drawing Sheets

LINEAR MOTOR DRIVEN VERTICAL LIFT STAGE

RELATED APPLICATION

This application is based upon Provisional Patent Application Ser. No. 60/012,422, filed Feb. 28, 1996.

BACKGROUND OF THE INVENTION

Many motion control applications require translation of a payload in three dimensions. Applications in the semiconductor and laser manufacturing fields require travel in the Z-direction (usually vertical) of less than 1 inch. Current solutions for the Z-direction motion include a traditional ball screw or lead screw driven stage, a lead screw driven wedge type lift stage and a piezoelectric driven lift stage. The traditional style screw driven stage requires substantial height to achieve a relatively small movement. In many cases, this is unacceptable as the stage will interfere with laser processing optics or semiconductor inspection equipment. Lead screw driven wedge devices are manufactured by a few motion control equipment suppliers. These have the advantage of providing small travels in a minimum space envelope. All drive mechanics are located below the payload. These stages have relatively good resolution (as high as 50 nanometers). However, backlash in the nut and screw/ coupling torsional windup limit the effectiveness of the high resolution. The acceleration, speed and system bandwidth for these stages are low, limiting process cycle times. Piezoelectric drives have compact profiles and excellent system response. However, the travel provided is limited to less than 0.1 mm and to small payloads, that is, less than 10 pounds.

It is an advantage, according to this invention, to provide a vertical lift stage for limited Z-direction motion which dramatically improves acceleration, maximum speed and system bandwidth performance. It is a further advantage to provide a lift stage with drive and feedback components that are noncontacting, thus eliminating wear and maintenance.

SUMMARY OF THE INVENTION

Briefly, according to this invention, there is provided a linear motor driven lift or positioning stage which comprises a base and a table having a mounting surface, wherein the table is connected to the base by linear motion guides that permit the table to move in the substantially vertical direction of a first axis. The table has a wedged surface opposite the mounting surface. A wedge is positioned between the wedge surface of the table and the base. The wedge is connected to the table and the base by linear motion guides to permit the wedge to move along a substantially horizontal second axis perpendicular to the first axis. A linear motor is positioned between the wedge and the base to move the wedge relative to the base along the second axis so that the table moves relative to the base along the first axis. A linear position encoder is positioned to encode the position of the wedge relative to the base. Preferably, the linear motor is a permanent magnet motor. It is also preferred that linear motion guides are positioned between the wedge and the wedge surface of the table.

BRIEF DESCRIPTION OF THE DRAWINGS

Further features and other objects and advantages of the invention will be apparent from the following detailed description made with reference to the drawings in which.

DESCRIPTION OF THE PREFERRED EMBODIMENTS

Figure 1:
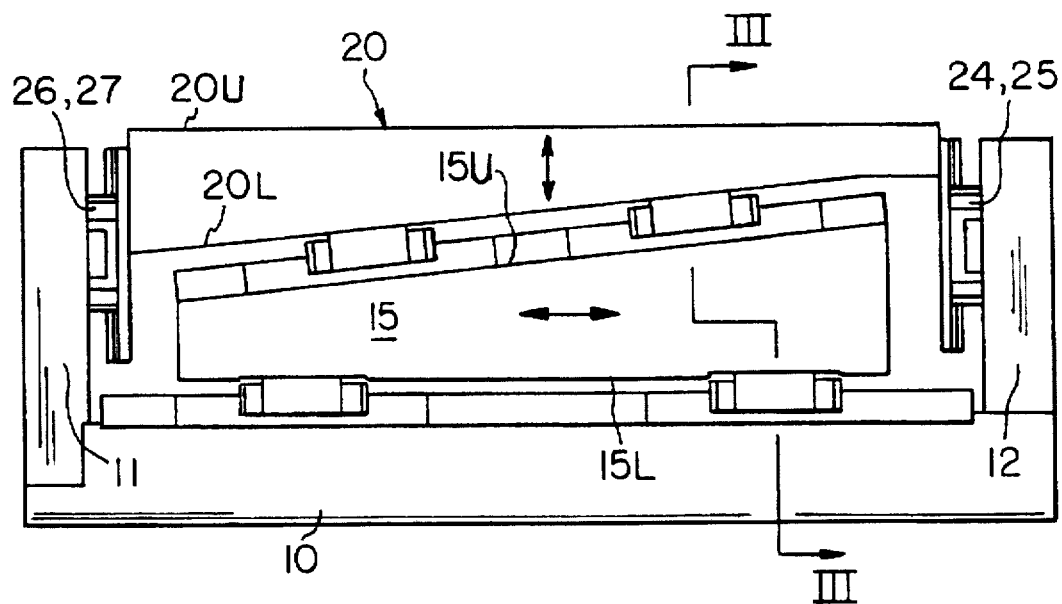
FIG. 1 is a side view of a linear motor driven vertical lift stage according to this invention.
Figure 2:
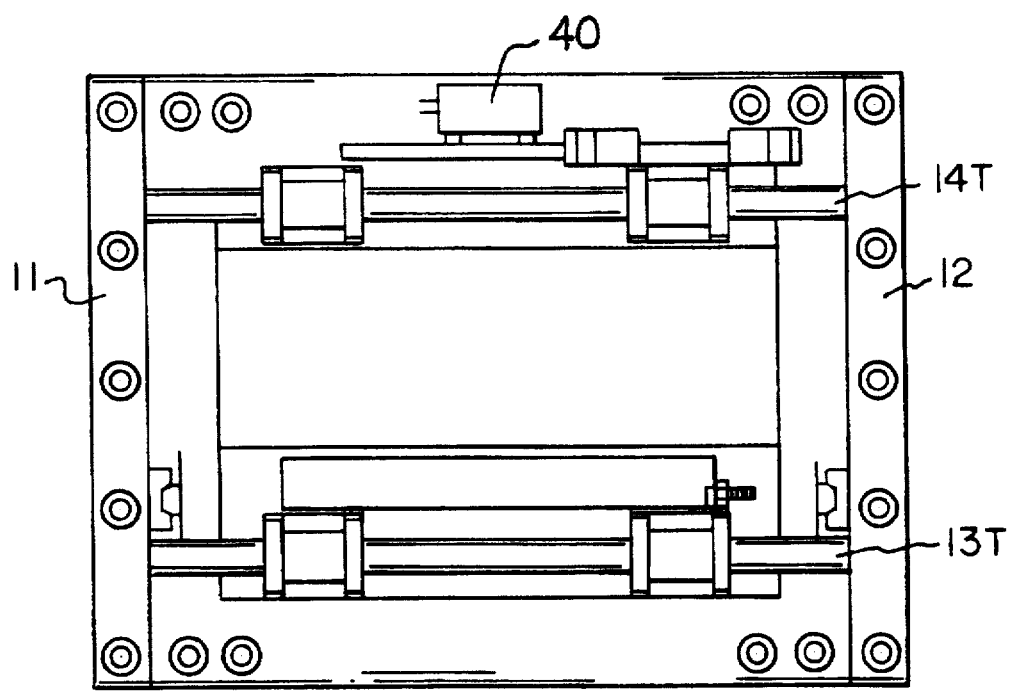
FIG. 2 is a plan view of a linear motor driven stage with the tabletop and wedge removed.
Figure 3:
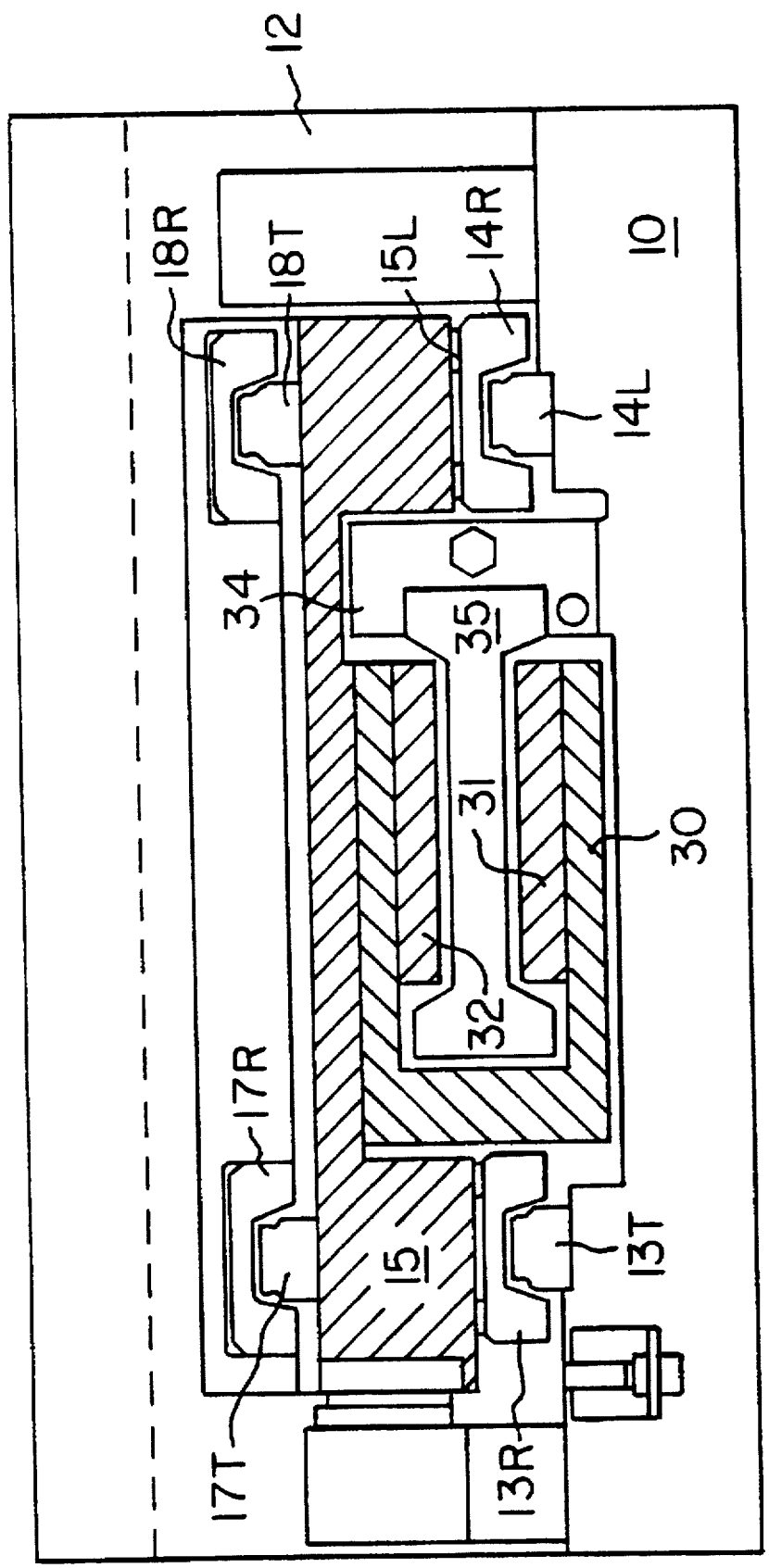
FIG. 3 is a section view of the linear motor driven stage taken along lines III—III in FIG. 1.

Referring to FIGS. 1, 2 and 3, a lift stage, according to this invention, comprises a base plate 10 which is, for example, a steel plate sized to resist deflection under the expected loads. End plates 11 and 12 are secured along opposite edges of the base plate to the upper surface thereof (as shown in the drawings) and substantially perpendicular to the base plate. The end plates may be held to the base plate by bolts or other fasteners. Attached to the top surface of the base plate are the elongate tracks or rolling guides 13T and 14T of the linear motion guides 13 and 14. Preferably, the linear motion guides or linear bearings are preloaded, no play, no backlash guides. Linear motion guides have elongate tracks and races that are guided by the tracks. The tracks and races can usually reverse positions.

Wedge 15 has two faces, 15U and 15L, the extensions of which would intersect. The rise-to-run ratio of the two faces as shown in the drawings is 1:10. Mounted to the bottom face 15L of the wedge are the outer races 13R and 14R of the linear motion guides 13, 14. Mounted to the top surface 15U of the wedge are the elongate tracks 17T and 18T of linear motion guides 17 and 18.

Tabletop 20 has two faces, 20U and 20L, the extensions of which would intersect at the same angle that the faces of the wedge would intersect if extended. Thus, the upper face of the tabletop may be maintained parallel to the upper surface of the base plate and a lower surface of the wedge while the upper surface of the wedge is maintained parallel to the lower surface of the tabletop. Mounted to the bottom surface of the wedge are the outer races 17R and 18R of the linear motion guides 17 and 18.

Mounted to the end plates 11 and 12 are the outer races of the linear motion guides 24, 25, 26 and 27.

As the wedge 15 moves right to left (as shown by arrows on the wedge in FIG. 1) guided by linear motion guides 13, 14, 17 and 18, the tabletop 20 moves up and down guided by linear motion guides 24, 25, 26 and 27. Every position of the top surface of the tabletop is parallel to every other position of that surface.

Mounted to a recess in the bottom of the wedge is the traveling magnet track for the linear motor. The magnet track comprises magnetic yoke 30 with a plurality of permanent magnets 31 and 32 secured thereto presenting alternating north and south poles. The linear motor forcer 34 comprises coils 35 defining magnetic poles according to how they are energized. The coils are secured to a mounting bracket 36 which in turn is secured to the base plate 10. The magnetic forcer may be secured by an air or water cooled mounting bracket 36. Examples of linear motors adaptable to this application are set forth in the book, *Linear Electric Motors: Theory, Design, and Practical Applications*, by Nasar and Boldea, Prentice Hall 1987. The forcer is a multiple phase, usually three phase, coil structure. By controlling the amount of current in each phase in ways well understood to those skilled in the art of linear motors, the forcer and therefore the wedge can be accurately positioned.

Mounted to the base plate is a linear encoder 40 that measures the right-to-left motion of the wedge. Due to the 1:10 rise-to-run ratio of the inclined surfaces on the wedge and table, the encoder output is also a measure of the up-down motion of the table. This results in a ten-fold mechanical amplification of the encoder signal.

The embodiment described with reference to FIGS. 1 to 3 offers high precision vertical motion of up to 5 mm. The stage configuration provides direct compression loading of the structural members. This eliminates cantilevering for most conventional payloads and minimizes position errors due to deflection caused by uneven loading.

The wedge travels in the horizontal plane guided by linear motion guide bearings. The translation motion is driven by the linear motor which is directly coupled to the base and the wedge. A noncontacting linear encoder on the wedge provides high resolution position feedback information.

The wedge incorporates two sets of linear motion guides. The lower set lies in the horizontal plane. The second set is inclined at a 1:10 slope. The horizontal motion of the wedge is converted into vertical motion of the tabletop by the inclined linear motion guides. The 1:10 incline provides a mechanical advantage which increases payload capacity of the linear motor and increases system resolution by a factor of 10. The vertical motion of the tabletop is guided in all angular directions and laterally by the linear guides attached to the wedge. The axial straightness is guided by additional sets of linear motion guides located in the vertical plane between the tabletop and the end plate assemblies. This arrangement provides a compact, extremely rigid, and highly accurate mechanical system.

It is an advantage, according to this invention, that the noncontacting linear feedback device can provide hysteresis free, high resolution (10 nanometers) positioning information. It is an advantage of this embodiment over the piezoelectric designs to provide greatly increased travel and payload capability. Very important, the embodiment described includes a wedge design and linear motion guide bearing arrangement which provides constant support geometry to load bearing components. This minimizes deflection and provides excellent trueness of travel. Pitch/yaw/roll errors are minimized when compared to other designs.

Having thus defined our invention with the detail and particularity required by the Patents Laws, what is desired protected by Letters Patent is set forth in the following claims.

What is claimed is:

1. A linear motor driven positioning stage comprising:

(a) a base;

(b) a carrier having a mounting surface, said carrier connected to the base by spaced linear motion guides that permit the carrier to move in the direction of a first axis, said carrier having a wedge surface opposite the mounting surface;

(c) a wedge positioned between the wedge surface of the carrier and the base, said wedge being connected to the table and the base by spaced linear motion guides to permit the wedge to move along a second axis perpendicular to the first axis;

(d) a linear motor positioned between the wedge and the base for moving the wedge relative to the base along the second axis whereby the carrier moves relative to the base along the first axis; and (e) a linear position encoder positioned to encode the position of the wedge relative to the base.

2. A linear motor driven lift stage comprising:

(a) a base;

(b) a table having a mounting surface, said table connected to the base by linear motion guides that permit the table to move in the substantially vertical direction of a first axis, said table having a wedge surface opposite the working surface;

(c) a wedge positioned between the wedge surface of the table and the base, said wedge being connected to the table and the base by linear motion guides to permit the wedge to move along a substantially horizontal second axis perpendicular to the first axis;

(d) a linear motor positioned between the wedge and the base for moving the wedge relative to the base along the second axis whereby the table moves relative to the base along the first axis; and (e) a linear position encoder positioned to encode the position of the wedge relative to the base.

3. A linear motor driven stage according to claim 1 or 2 wherein the linear motor is a permanent magnet motor.

4. A linear motor driven stage according to claim 3 in which the linear motor comprises magnets (the linear motion magnet track) fixed relative to the wedge and an armature winding (the linear motor forcer) fixed relative to the base.

5. A linear motor driven stage according to claim 3 in which the linear motor comprises magnets (the linear motor magnet track) fixed relative to the base and an armature winding (the linear motion forcer) fixed relative to the wedge.

6. A linear motor driven stage according to claim 1 or 2 wherein the orientation of the wedge surfaces establishes a ratio of movement along the first axis relative to movement along the second axis between 1:1 and 1:1000.

7. A linear motor driven stage according to claim 1 or 2 wherein the orientation of the wedge surfaces establishes a ratio of movement along the first axis relative to movement along the second axis between 1:5 and 1:10.

8. A linear motor driven stage according to claim 1 or 2 wherein the linear motion guides are preloaded, no play, no backlash guides.

9. A linear motion driven stage according to claim 1 or 2 wherein the mounting surface is substantially planar and the linear motion guides between the wedge and the base lie in a plane parallel to the mounting surface.

10. A linear motion driven stage according to claim 1 or 2 wherein the wedge surfaces form supplementary angles with the mounting surface and the plane of the linear motion guides between the wedge and the base.

11. A linear motion driven stage according to claim 1 or 2 wherein the linear motor is a brushless linear servomotor having a rare earth magnet track.

* * * * *

UNITED STATES PATENT AND TRADEMARK OFFICE
CERTIFICATE OF CORRECTION

PATENT NO.   : 5,731,641
DATED        : March 24, 1998
INVENTOR(S)  : Stephen J. Botos and Albert P. Ciez It is certified that error appears in the above-identified patent and that said Letters Patent is hereby corrected as shown below:

Claim 7 Column 4 Line 43 "1:5 and 1:10" should read --1:5 and 1:100--.

Claim 9 Column 4 Line 47 "linear motion" should read --linear motor driven--.

Claim 10 Column 4 Line 51 "linear motion" should read --linear motor driven--.

Claim 11 Column 4 Line 55 "linear motion" should read --linear motor driven--.

Signed and Sealed this

Twenty-first Day of July, 1998

Attest:

BRUCE LEHMAN

*Attesting Officer*   Commissioner of Patents and Trademarks